(12) United States Patent
Agrawal et al.

(10) Patent No.: US 6,653,861 B1
(45) Date of Patent: Nov. 25, 2003

(54) MULTI-LEVEL ROUTING STRUCTURE FOR A PROGRAMMABLE INTERCONNECT CIRCUIT

(75) Inventors: Om P. Agrawal, Los Altos, CA (US); Jinghui Zhu, San Jose, CA (US)

(73) Assignee: Lattice Semiconductor Corporation, Hillsboro, OR (US)

(*) Notice: Subject to any disclaimer, the term of this patent is extended or adjusted under 35 U.S.C. 154(b) by 7 days.

(21) Appl. No.: 10/023,053

(22) Filed: Dec. 14, 2001

(51) Int. Cl.[7] .............................................. H03K 19/77
(52) U.S. Cl. .............................. 326/41; 326/40; 326/39
(58) Field of Search ..................................... 326/38–41

(56) References Cited

U.S. PATENT DOCUMENTS

| | | | |
|---|---|---|---|
| 5,886,538 A | * 3/1999 | New | ........................ 326/40 |
| 5,986,470 A | * 11/1999 | Cliff et al. | ..................... 326/41 |
| 6,034,541 A | * 3/2000 | Kopec et al. | .................. 326/39 |
| 6,104,207 A | * 8/2000 | Chan et al. | .................... 326/40 |
| 6,184,713 B1 | 2/2001 | Agrawal et al. | |

* cited by examiner

Primary Examiner—Vibol Tan
(74) Attorney, Agent, or Firm—MacPherson Kwok Chen & Heid LLP

(57) ABSTRACT

A programmable interconnect circuit comprising a plurality of I/O cells arranged into I/O blocks includes a routing structure for each I/O block, wherein each routing structure may have a partially populated first level for programmably routing signals from the I/O cells into a first set of output signals. A second level of the routing structure programmably routes signals from the first set of output signals to I/O cells in the routing structure's I/O block.

27 Claims, 18 Drawing Sheets

| 4B-1 | 4B-2 | 4B-3 | 4B-4 |
|---|---|---|---|
| 4B-5 | 4B-6 | 4B-7 | 4B-8 |

FIG. 4B

MULTI-LEVEL ROUTING STRUCTURE FOR A PROGRAMMABLE INTERCONNECT CIRCUIT

RELATED APPLICATION

This application is related to U.S. application "Block-Oriented Architecture for a Programmable Interconnect Circuit," Ser. No. 10/022,464, concurrently filed herewith and incorporated by reference herein, U.S. application "I/O Block for a Programmable Interconnect Circuit," Ser. No. 10/021,844, concurrently filed herewith and incorporated by reference herein.

BACKGROUND

1. Field of the Invention

This invention relates generally to programmable interconnect circuits, and more particularly to a multi-level routing structure for such a circuit.

2. Description of Related Art

In-system-programmable interconnect devices permit a user to programmably route signals between pins of the device. For example, Lattice Semiconductor Corp. currently manufactures an ispGDX® family of programmable interconnect devices having a non-volatile E2CMOS® in-system-programmable crossbar switch matrix for programmable switching, interconnect, and jumper functions. Each pin of the ispGDXS® device is associated with an input/output (I/O) circuit that programmably couples to other I/O circuits through a routing structure denoted as a global routing pool (GRP). The I/O circuits contain registers allowing the input and output signals on the associated pins to be selectively registered.

Referring now to FIG. 1, an input/output circuit 10 for an ispGDX® device couples to a 4:1 multiplexer (Mux) 12 that receives signals A, B, C, and D from four different routing structures, GRP_A, GRP_B, GRP_C, and GRP_D, (not illustrated) respectively. Each routing structure corresponds to a given quadrant (a side of the integrated circuit) for the device. Accordingly, GRP_A receives the input signals from I/O pins 20 in quadrant A, GRP_B receives the input signals from I/O pins 20 in quadrant B, and so on. Input/output circuit 10 receives its input signals from its pin 20 and directs them to the appropriate global routing structure on path 19. For example, if I/O circuit is within quadrant A, path 19 would couple to GRP_A.

Each routing structure is a switch matrix that may receive input signals from selected I/O circuits and programmably route output signals to selected I/O circuits. For clarity, the individual structures are grouped together and jointly designated by a single routing structure 14. A similar device or circuit is disclosed in U.S. Pat. No. 6,034,541, the contents of which are hereby incorporated by reference in their entirety. In addition, each global routing pool has a switch matrix fused by an in-system-programmable non-volatile E2CMOS® memory bank, configured for one-way routability. A given memory cell in the volatile E2CMOS® memory bank controls the state of a "fuse point" in the switch matrix. The fuse point may be formed by, e.g., a pass transistor that will programmably connect an input lead of the switch matrix to an output lead of the switch matrix, depending upon the logical state (high or low) of the fuse point's memory cell. I/O pins 20 to the device are arranged in quadrants (the four sides to the chip) such that an individual routing structure receives signals from the I/O circuits 10 in a single quadrant and may distribute these signals to the I/O circuits 10 in all four quadrants. Thus, the four input signals A, B, C, and D for each Mux 12 are "quadrant" limited to originate in their respective quadrants. Note that, with respect to routing structure 14, each I/O circuit 10 is independent and separate from the remaining I/O circuits. Because routing structure 14 distributes signals independently to each I/O circuit 10, the resulting arrangement may be denoted as "pin-oriented" or "bit-oriented" in that each I/O circuit 10 associates with a single I/O pin 20.

Similar to the data signals, control signals, such as the set/reset, clock, and clock enable (CE) for an input/output register (not illustrated) located within I/O circuit 10, the output enable (OE) for an output buffer (not illustrated) located within I/O circuit 10, as well as the MUX selects for MUX 12, are also limited to originating in a subset of pins 20 from each quadrant. Moreover, the prior art device had no control logic capability for these control signals such that the control function for each signal was limited to a single pin.

Although this "bit-oriented" architecture allowed a user to programmably interconnect signals through the device, the number of fuses in the resulting global routing pool becomes prohibitive as the pin count increases. However, modern board density continues to increase, demanding an interconnect device having a suitable number of pins to interconnect the signals.

Accordingly, there is a need in the art for an improved programmable interconnect device that uses fewer fuses and provides greater flexibility in the mapping of data and control signals.

SUMMARY

In accordance with one aspect of the invention, a programmable interconnect circuit includes a plurality of I/O circuits arranged into I/O blocks. Each I/O block has its own routing structure programmably coupling I/O signals between the I/O block's I/O circuits and the I/O circuits in the remaining I/O blocks. Each routing structure has a partially-populated first switch matrix that programmably routes signals from the I/O circuits into a first set of output signals. A second switch matrix programmably routes the first set of output signals into a second set of output signals that is in turn coupled to I/O circuits in the routing structure's I/O block.

The invention will be more fully understood upon consideration of the detailed description below, taken together with the accompanying drawings.

BRIEF DESCRIPTION OF THE DRAWINGS

FIG. 4b illustrates a fusing pattern for the first level data-path routing structure of FIG. 4a.

FIG. 5b illustrates a fusing pattern for the second level control-path routing pool structure of FIG. 5a.

Use of the same reference symbols in different figures indicates similar or identical items.

DETAILED DESCRIPTION OF THE PREFERRED EMBODIMENTS

Figure 1:
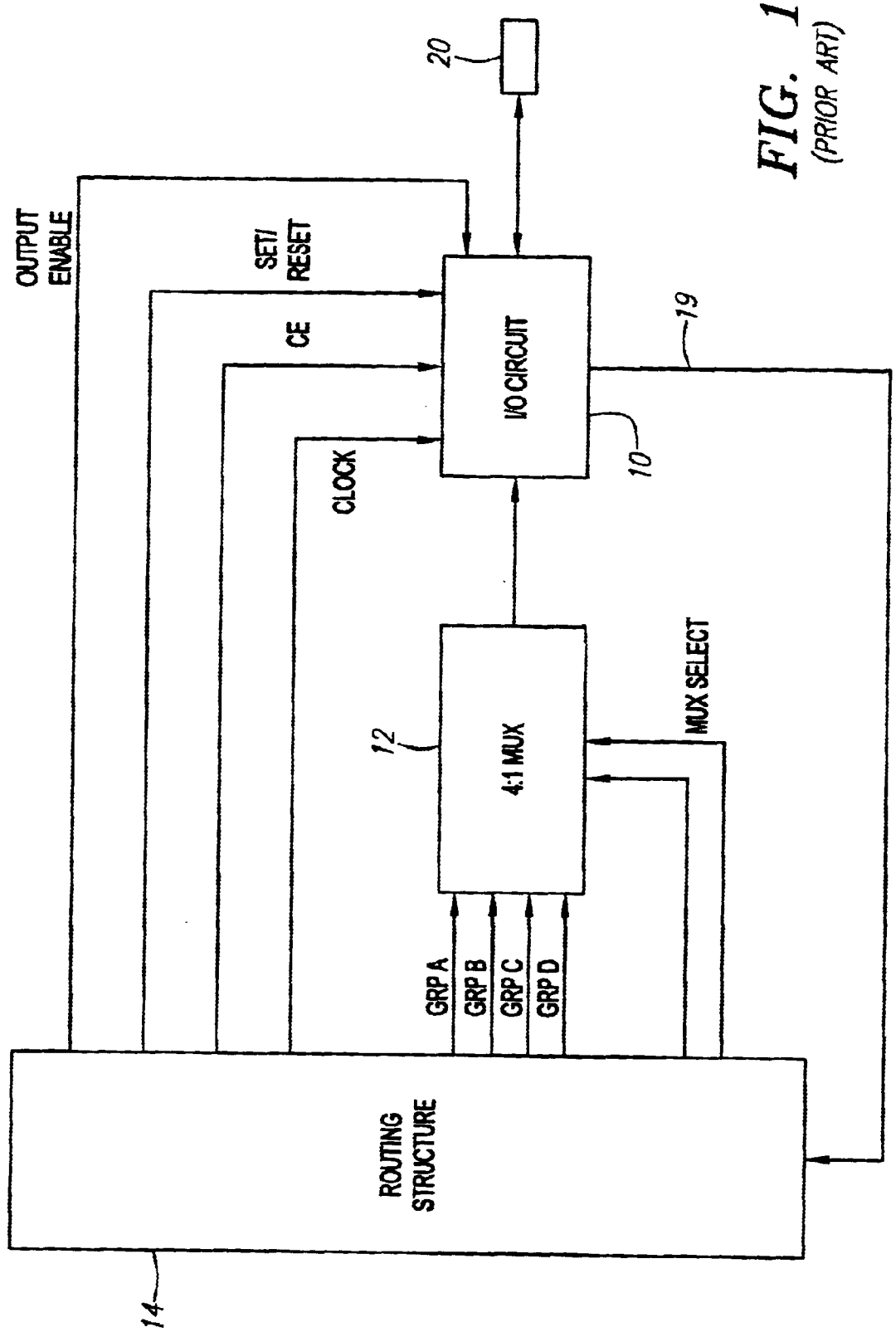
FIG. 1 illustrates a prior art programmable interconnect architecture.
Figure 2:
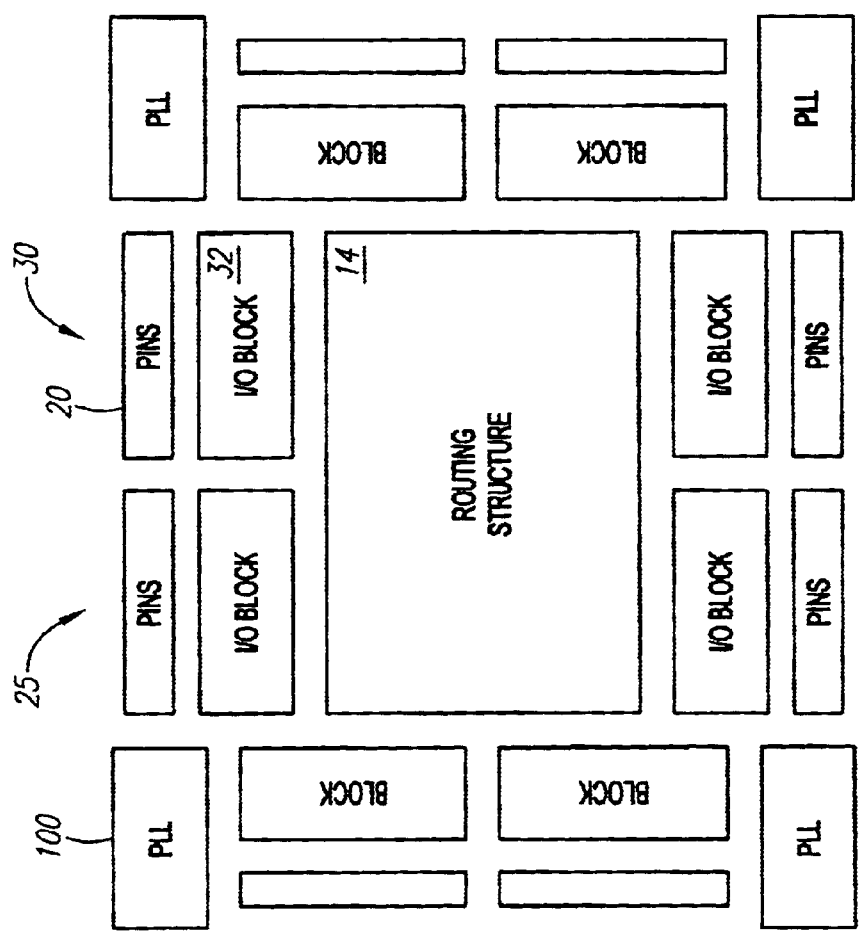
FIG. 2 illustrates a block-oriented architecture for a programmable interconnect circuit according to one embodiment of the invention.
Figure 3:
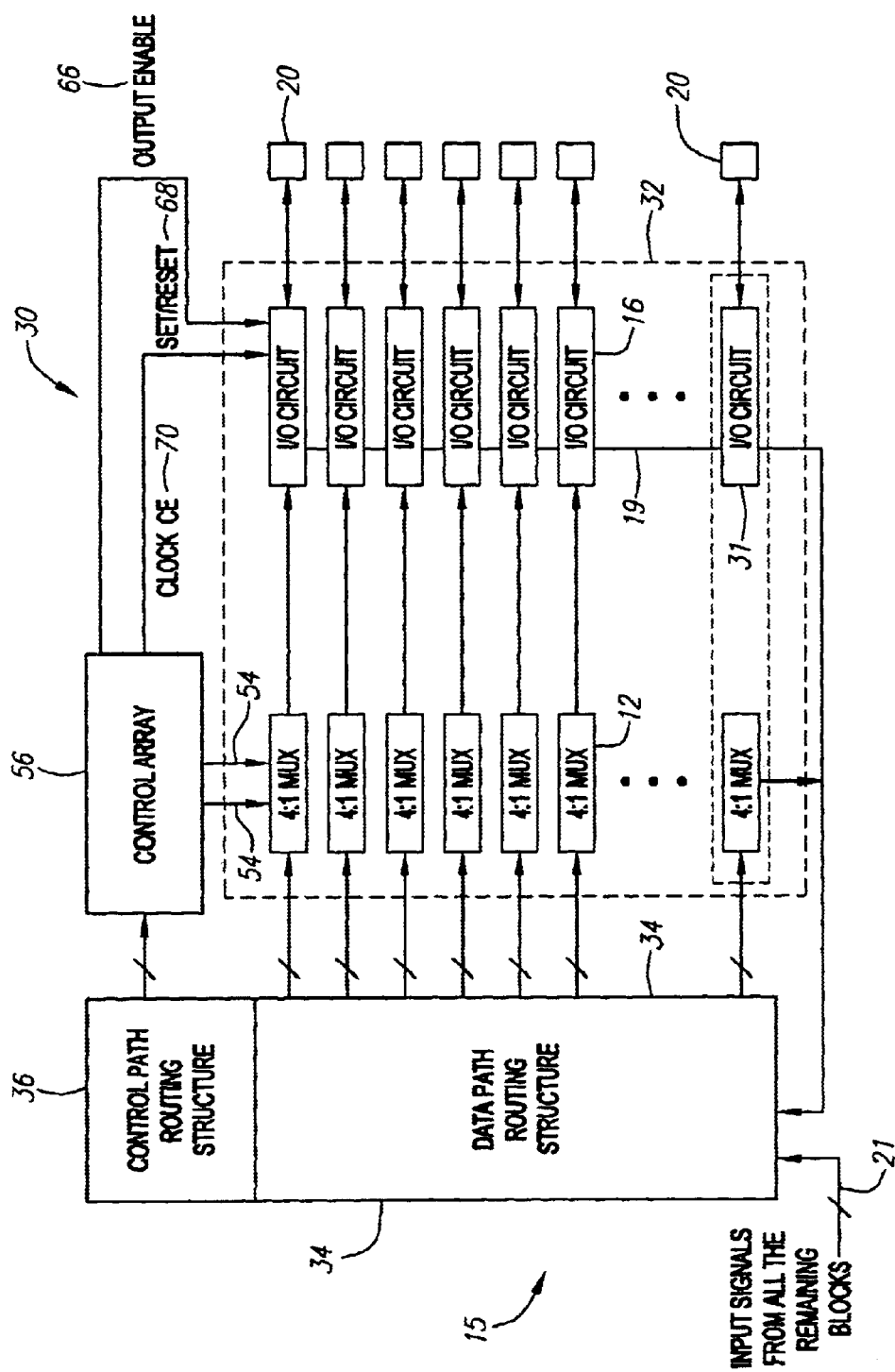
FIG. 3 illustrates further aspects of block-oriented architecture for the programmable interconnect circuit of FIG. 2 according to one embodiment of the invention.

Referring now to FIGS. 2 and 3, a programmable interconnect device 25 having a "block-oriented" programmable interconnect architecture 30 is illustrated. In contrast to the "bit-oriented" architecture of the prior art, the I/O circuits 16 (FIG. 3) are arranged in I/O blocks 32 such that each block 32 having a plurality X of I/O circuits 16 associates with its own routing structure 15 (FIG. 3). In general, X is arbitrary as any number of I/O circuits 16 may be assigned to an I/O block 32. However, because bus-switching applications typically route binary signals in groups of 8 (one byte) or 16 (two bytes), assigning 16 I/O circuits per I/O block 32 as illustrated in FIG. 3 is particularly convenient. It will be appreciated, however, that other numbers of I/O circuits per I/O block may be used, for example, 4 or 8. Each I/O circuit 16 may be contained within an I/O cell 31, which also includes a 4:1 Mux 12 for selecting data signal inputs for its I/O circuit 16 (for clarity, only one I/O cell 31 is illustrated in FIG. 3). In FIG. 2, the routing structures 15 are collectively denoted as a single routing structure 14. Referring again to FIG. 3, each I/O circuit 16 may receive input signals from its pin 20. These input signals may comprise data signals that will ultimately be routed to other pins 20. Alternatively, these input signals may comprise control signals for controlling, for example, multiplexers 12 or registers within I/O circuits 16.

As will be described further herein, interconnect device 25 is programmable because of its association with a programmable memory (not illustrated), which is typically non-volatile but may be implemented as a volatile memory if desired. A user would program memory elements within the programmable memory to desired logic levels. These memory elements then control programmable elements such as fuse points, multiplexers, and switches within interconnect device 25 so as to effect a desired mode of operation. The programmable memory is preferably in system programmable, such that a user may change the programming during operation of the interconnect device.

Each I/O block 32 may receives signals from two independent routing structures contained within routing structure 15: a data-path routing structure 34 for programmably routing data signals, and a second control-path routing structure 36 for programmably coupling control signals to a control array 56, which in turn provides product-term control signals to block 32. It will be appreciated that although data-path routing structure 34 and the control-path routing structure 36 are independent, such independence may be conceptual only in that the data-path routing structure 34 and control-path routing structure 36 may be combined into a single global routing structure. For example, a single switch matrix may accommodate both data and control signals. However, the fuse patterns within the switch matrix or global routing structure may differ according to whether data signals or control signals are being routed.

As discussed in co-pending U.S. application "I/O Block for a Programmable Interconnect Circuit," control array 56 within I/O block 32 produces a set of product-term control signals. One set of product-term signals provides the MUX select signals 54 for the 4:1 MUXes 12. Each I/O circuit 16 may include an input register, an output register, and an output enable register as discussed in co-pending U.S. application "Block-Oriented Architecture for a Programmable Interconnect Circuit." Other sets of product-term signals from the control array 56 provide the clock and clock enable (CE) signals 70, the set/reset signals 68 and the output enable (OE) signals 66 for these registers.

Figure 4A:
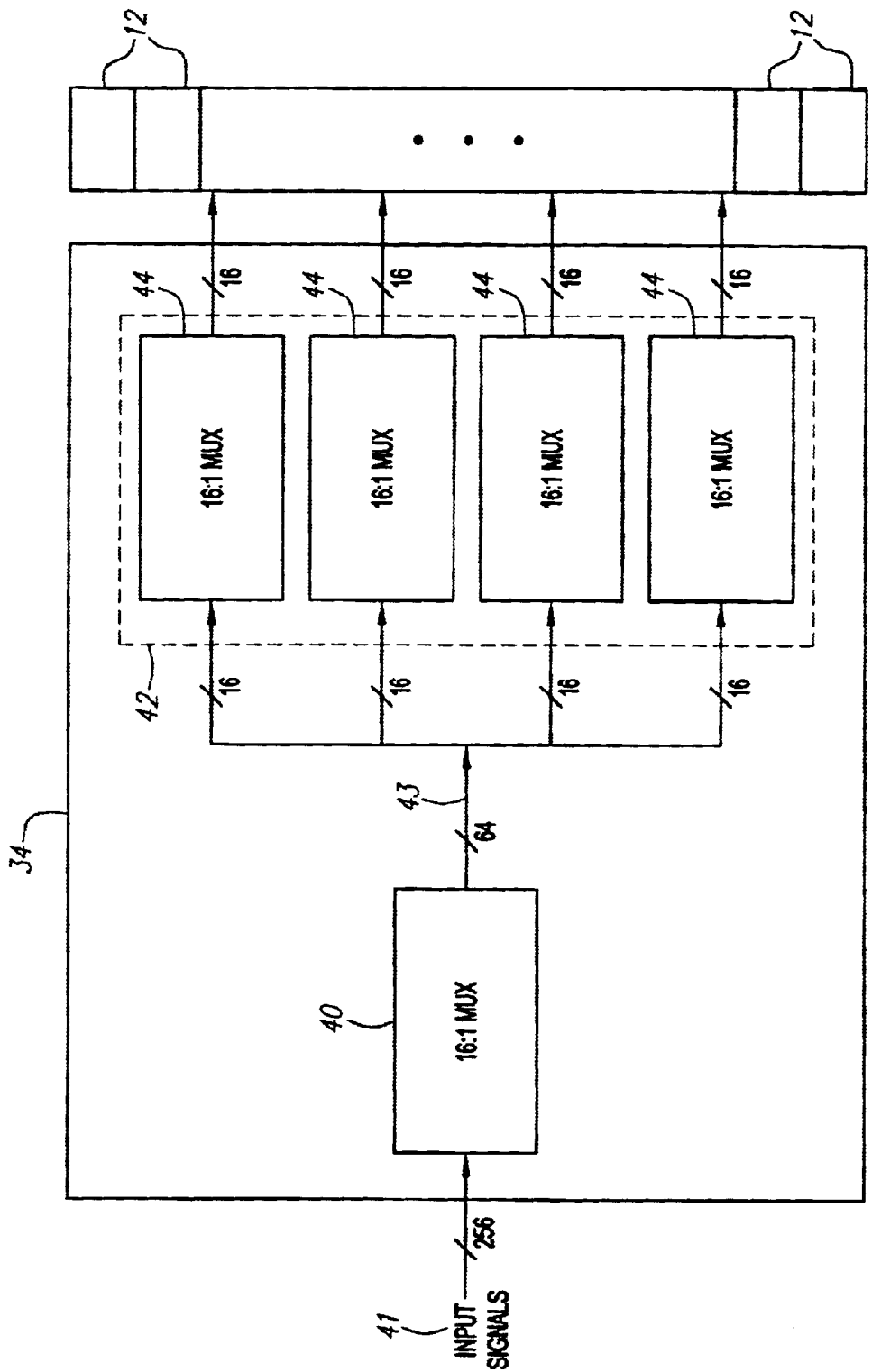
FIG. 4a illustrates a two level data-path routing structure for a 256 pin device according to one embodiment of the invention.

Arranging the I/O cells into I/O blocks 32 allows each data-path routing structure 34 and control-path routing structure 36 to be arranged in a two-level organization. For example, as shown in FIG. 4a, data-path routing structure 34 may comprise a first level data-path routing structure 40 and a second level data-path routing structure 42. First level data-path routing structure 40 may receive input signals 41 that may originate from pins 20 corresponding to all I/O blocks 32 of the interconnect device 25. Each pin 20 associates with its own I/O circuit 16. Thus, if there are 256 I/O circuits 16 corresponding to 256 pins 20, first level data-path routing structure 40 may receive 256 I/O signals. To reduce the fuse count, first level data-path routing structure's 40 switch matrix, discussed further with respect FIG. 4b and fused by a non-volatile E²CMOS® memory bank (not illustrated), may be only partially populated. As a result, first level data-path routing structure 40 may form an M:1 MUX for each output signal carried from first level data-path routing structure 40 on bus 43, where M corresponds to the ratio of the total number of I/O signals 41 feeding first level data-path routing structure 40 to the total number of I/O circuits 16 within the associated I/O block 32. Accordingly, given that I/O blocks 32 each have a fixed number X of I/O circuits, the total number of I/O signals 41 feeding first level data-path routing structure 40 becomes (N*X), where N is the total number of I/O blocks. M then equals (N*X)/X, which equals N, the total number of I/O blocks. Thus, the M:1 MUX formed for each output signal on bus 43 from first level data-path routing structure 40 depends upon the number of I/O blocks 32 used in interconnect device 25. If there are sixteen I/O blocks 32, the fuse pattern within first level data-path routing structure 40 is such that it forms a 16:1 MUX for each output signal carried on bus 43. Because the 4:1 MUX 12 (FIG. 3) coupled to each I/O circuit 16 within an I/O cell 31 requires 4 input signals, an I/O block 32 having 16 I/O cells requires 64 input signals. In such an embodiment, the first level data-path routing structure 40 will thus have 64-bit wide output bus 43.

Figures 1, 4B:
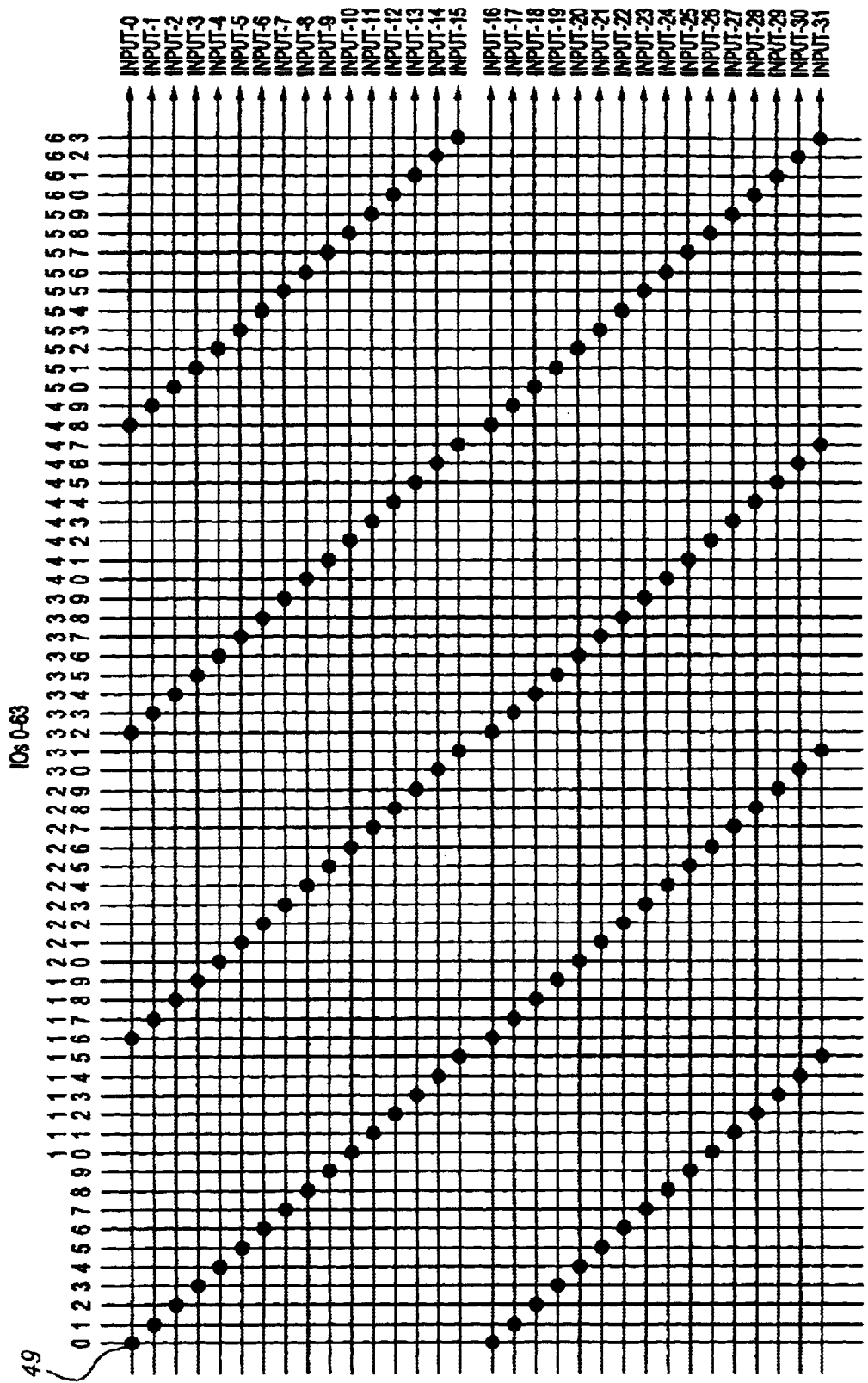
Figures 2, 4B:
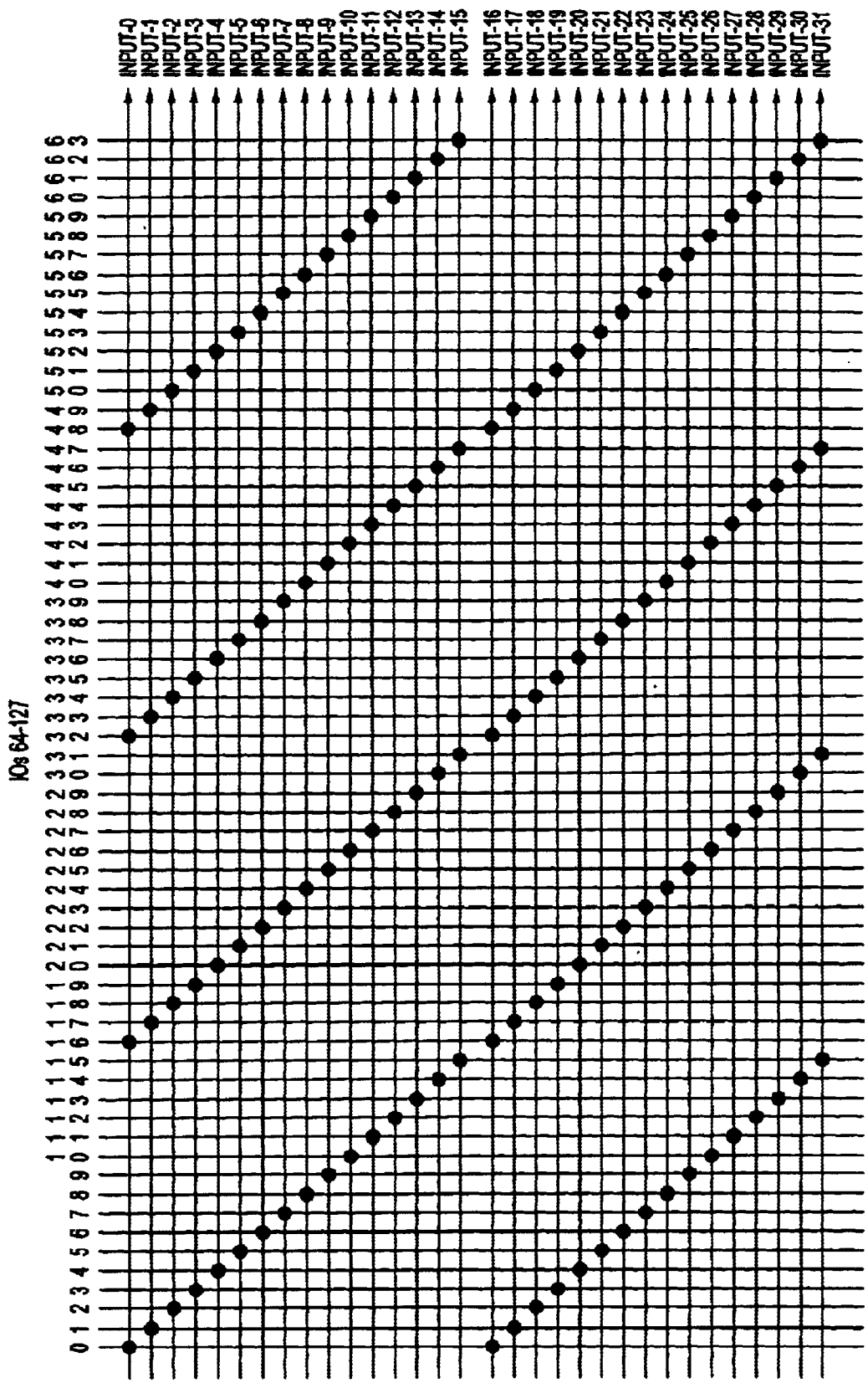
Figures 3, 4B:
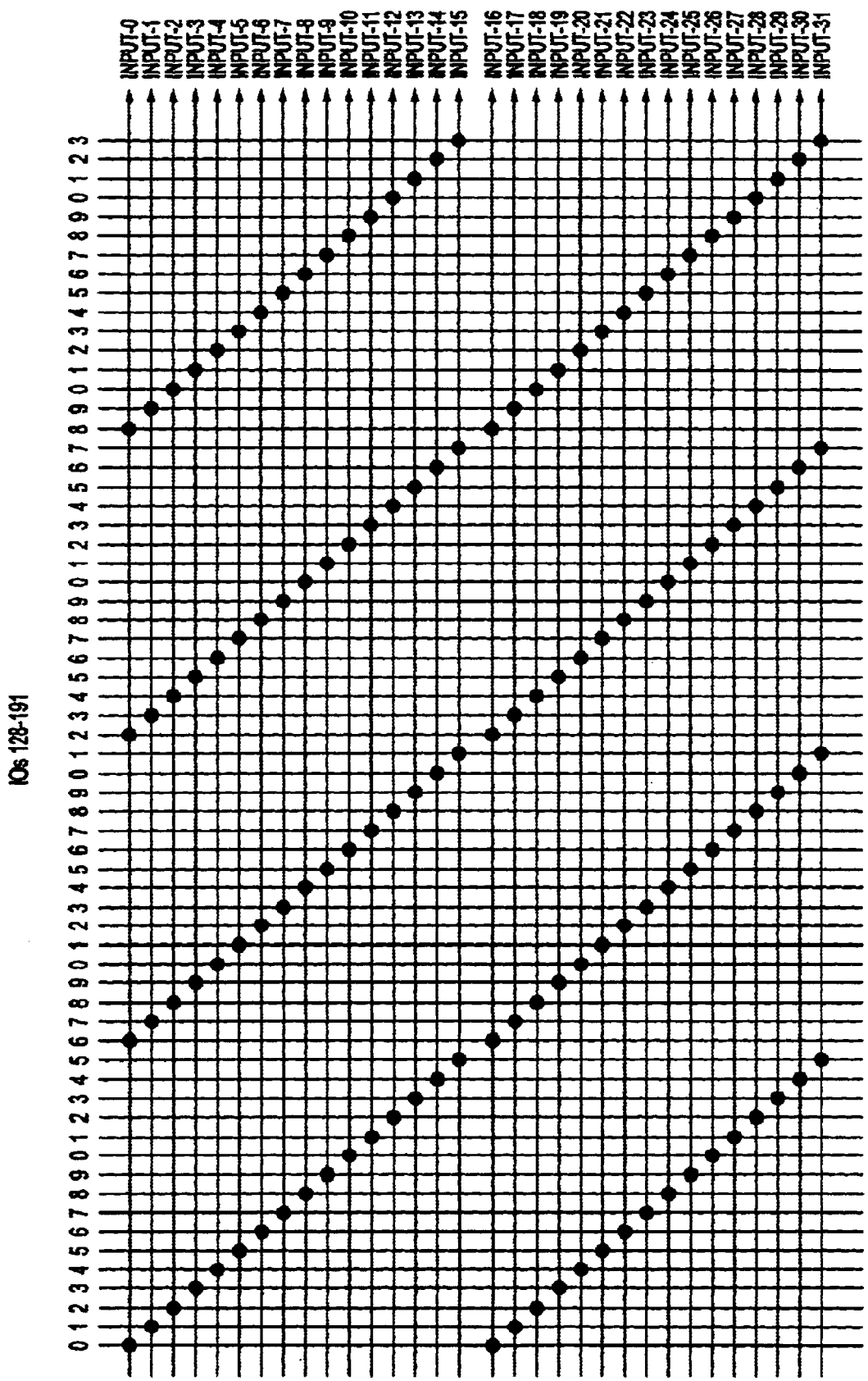
Figures 4, 4B:
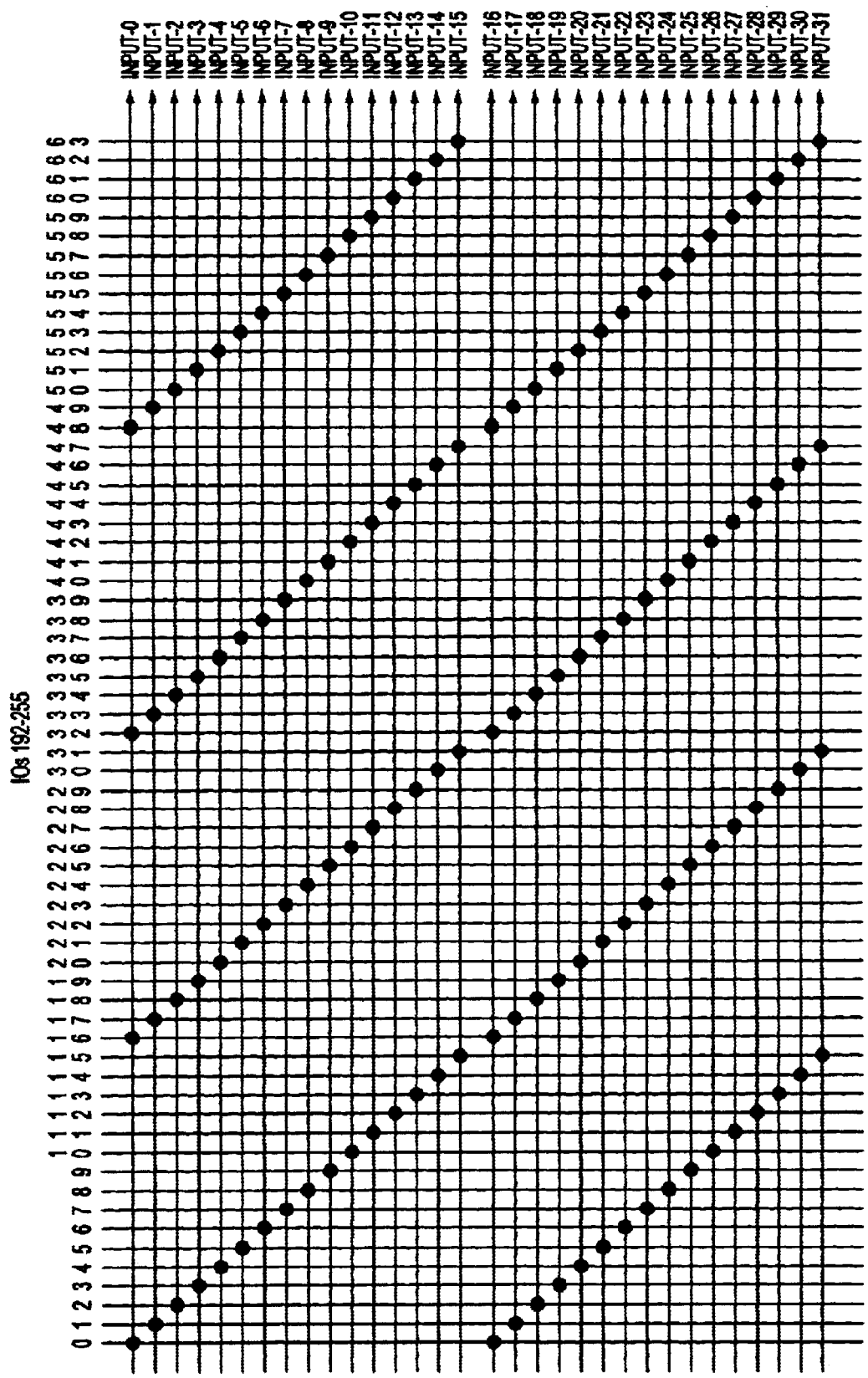
Figures 4, 4B, 5:
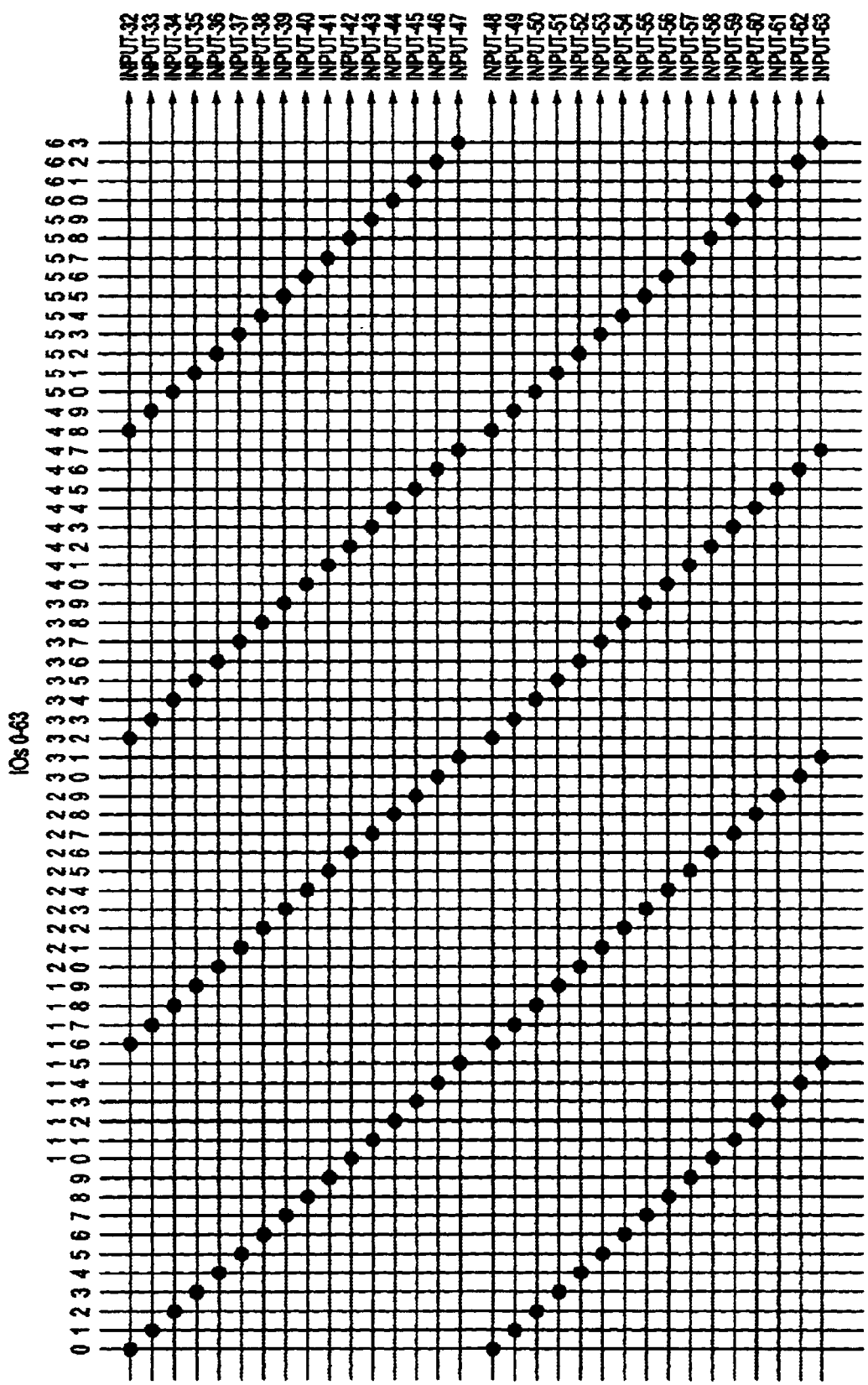

FIG. 4b illustrates the partially-populated fusing pattern for the switch matrix in first level data-path routing structure 40 for a 256 pin device 25 having 16 I/O blocks 32, each having sixteen I/O circuits 16. At each darkened intersection 49, a one-bit memory cell, typically an electrically erasable in-system-programmable read-only memory cell (E²PROM element), couples to a pass transistor to programmably fuse a data-path routing structure input signal 41 to an output signal that will be carried on bus 43. Thus, first level data-path routing structure 40 implements static routing. As discussed with respect to FIG. 4a, first level data-path routing structure 40 may receives 256 input signals 41 (numbered 0 through 255 in FIG. 4b) and routes these received signals into 64 output signals (numbered 0 through 63 in FIG. 4b) to be carried on bus 43. First level data-path routing structure 40 is four-way routed in that each input signal 41 has four different paths it may take to reach the output as follows. Consider input signal number 0 illustrated in FIGS. 4b–1 and 4b–5. This input may be fused at the intersections 49 to form output signals numbers 0, 17, 34, and 49, thereby providing four ways for input signal number 0 to reach the output.

To permit increased flexibility in signal routing to any given I/O circuit 16, a second level data-path routing structure 42 couples output signals on bus 43 from first level data-path routing structure 40 to the associated I/O block 32. The switch matrix for the second level data-path path routing structure 42 may be fully populated, wherein it is fused by a non-volatile E²CMOS® memory bank. The second level data-path path routing structure 42 may be conceptually organized into groups of X signals corresponding to the number X of I/O circuits 16 assigned to any given I/O block 32. For an X=16 architecture, the resulting second level data-path path routing structure 42 is organized into four blocks of switch matrices 44a through 44d as shown in FIG. 4a, each corresponding to a consecutive group of 16 signals from first level data-path path routing structure 40. Each block 44 provides 16 signals as data inputs for four 4:1 MUXes 12 within an I/O cell 31 (FIG. 3). The resulting fully-populated switch matrices blocks 44a–44d for the second level data-path path routing structure 42 of a 256 pin device 25 having sixteen I/O blocks 32 of sixteen I/O circuits 16 each is illustrated in FIG. 4c. It will be appreciated that a partially-populated switch matrix could be implemented in second level data-path routing structure 42 at the cost of routing flexibility.

Note that each group of 16 signals provided by the first level data-path routing structure 40 is derived from any of the 256 input signals. Because the block 44 in the second level data-path path routing structure 42 receiving these 16 signals has a fully-populated switch matrix, the four inputs for any given 4:1 MUX 12 can come from any of the 256 input signals. This routing is advantageous over the prior art architecture discussed with respect to FIG. 1. The inputs to 4:1 MUX 12 are no longer "quadrant" restricted, in that the inputs to 4:1 MUX 12 can come from one side, two sides, three sides, or all four sides of the device. In addition to removing the quadrant restriction of the prior art, organizing data-path routing structure 34 into two levels provides a significant reduction in fuse count over the "bit-oriented" one level data-path routing structure approach of the prior art.

Figure 5A:
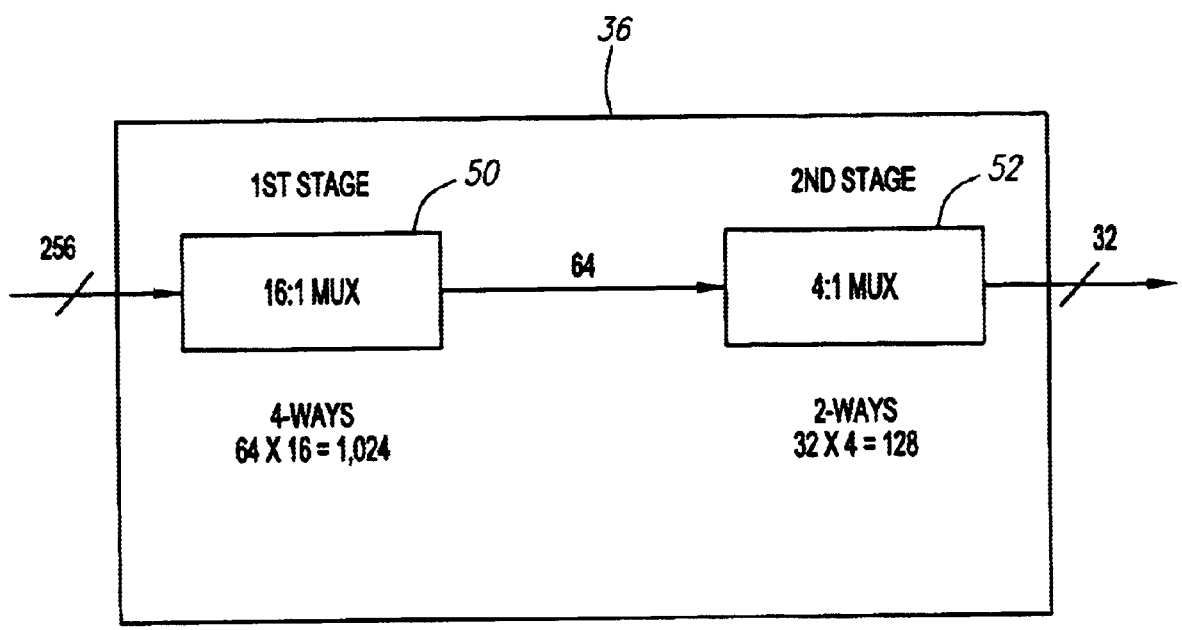
FIG. 5a illustrates a two level control-path routing structure according to one embodiment of the invention.

A similar two-level organization may be used for the control-path routing structure 36 such that control-path routing structure 36 comprises a first level control-path routing structure 50 and a second level control-path routing structure 52 as shown in FIG. 5a. For a device having 256 I/O circuits 16, a first level control-path path routing structure 50 may receive 256 different input signals. The switch matrix (not illustrated) for first level control-path routing structure 50 is fused such that each output of the first level control path routing structure 50 forms an M:1 MUX corresponding to the total number of I/O blocks 32 as discussed with respect to the first level data-path routing structure 40. In an embodiment wherein interconnect device 25 has sixteen I/O blocks 32, first level control-path routing structure 50 thus forms a 16:1 MUX for each of 64 output signals. Accordingly, first level control-path routing structure 50 may have a similar fuse pattern to that used for first level data-path routing structure 40 as illustrated in FIG. 4b. Both first level control-path routing structure 50 and second level control-path routing-structure 52 may be fused according to configuration data stored in a non-volatile memory such as an E²CMOS® memory bank.

Figure 5B:
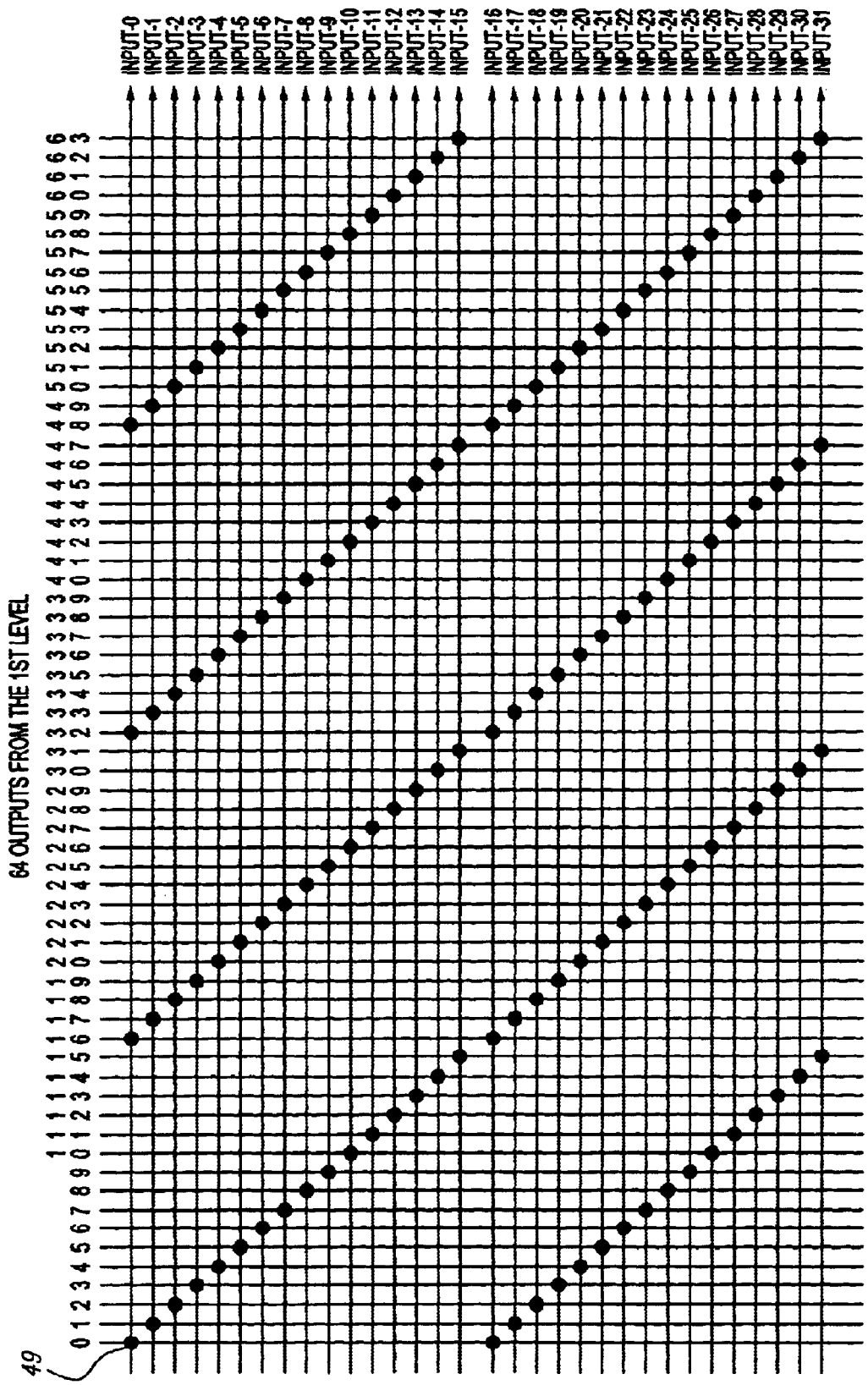
Figure 6:
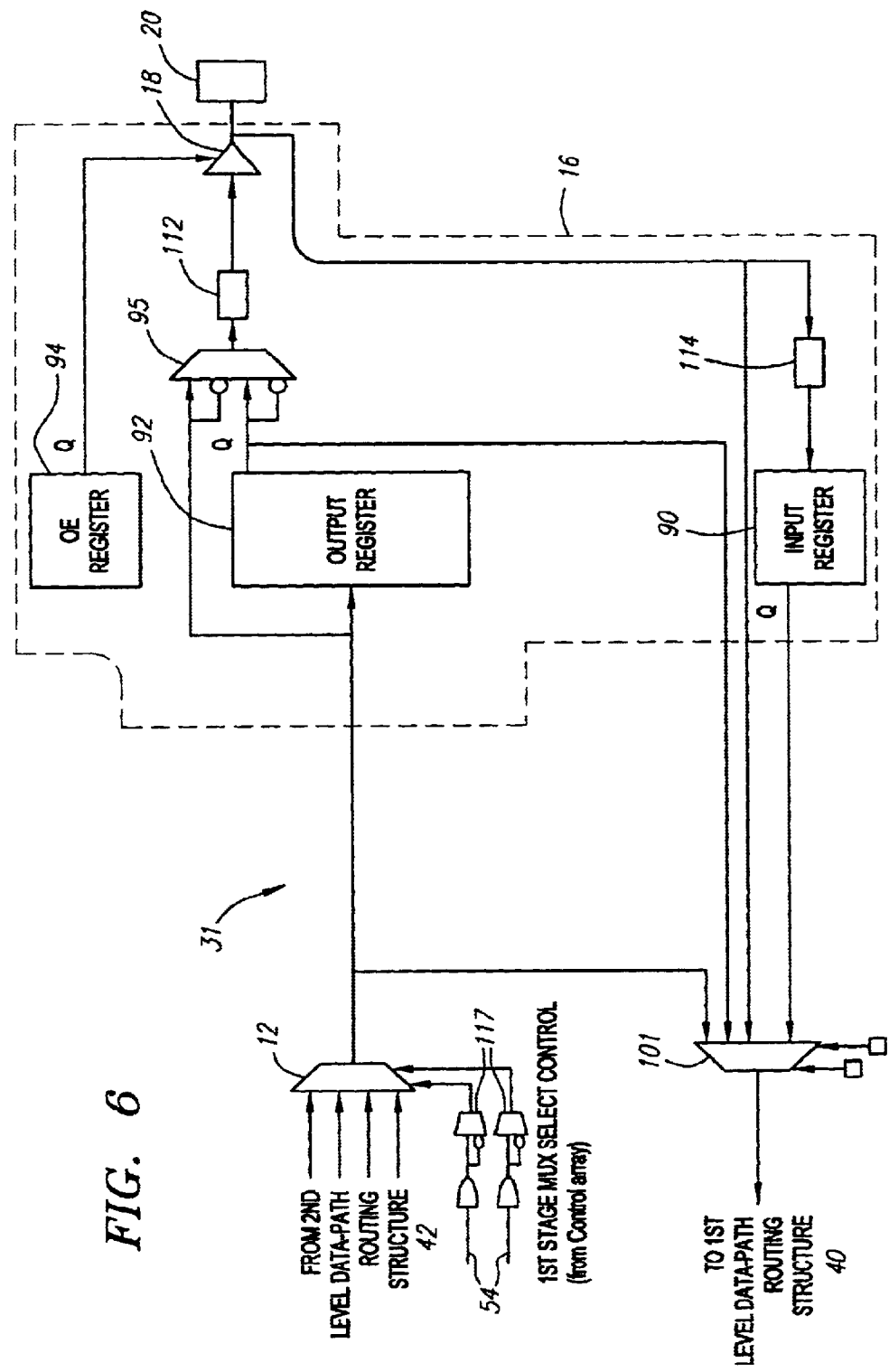
FIG. 6 is a block diagram for the I/O circuit shown in FIG. 3.
Figure 3:
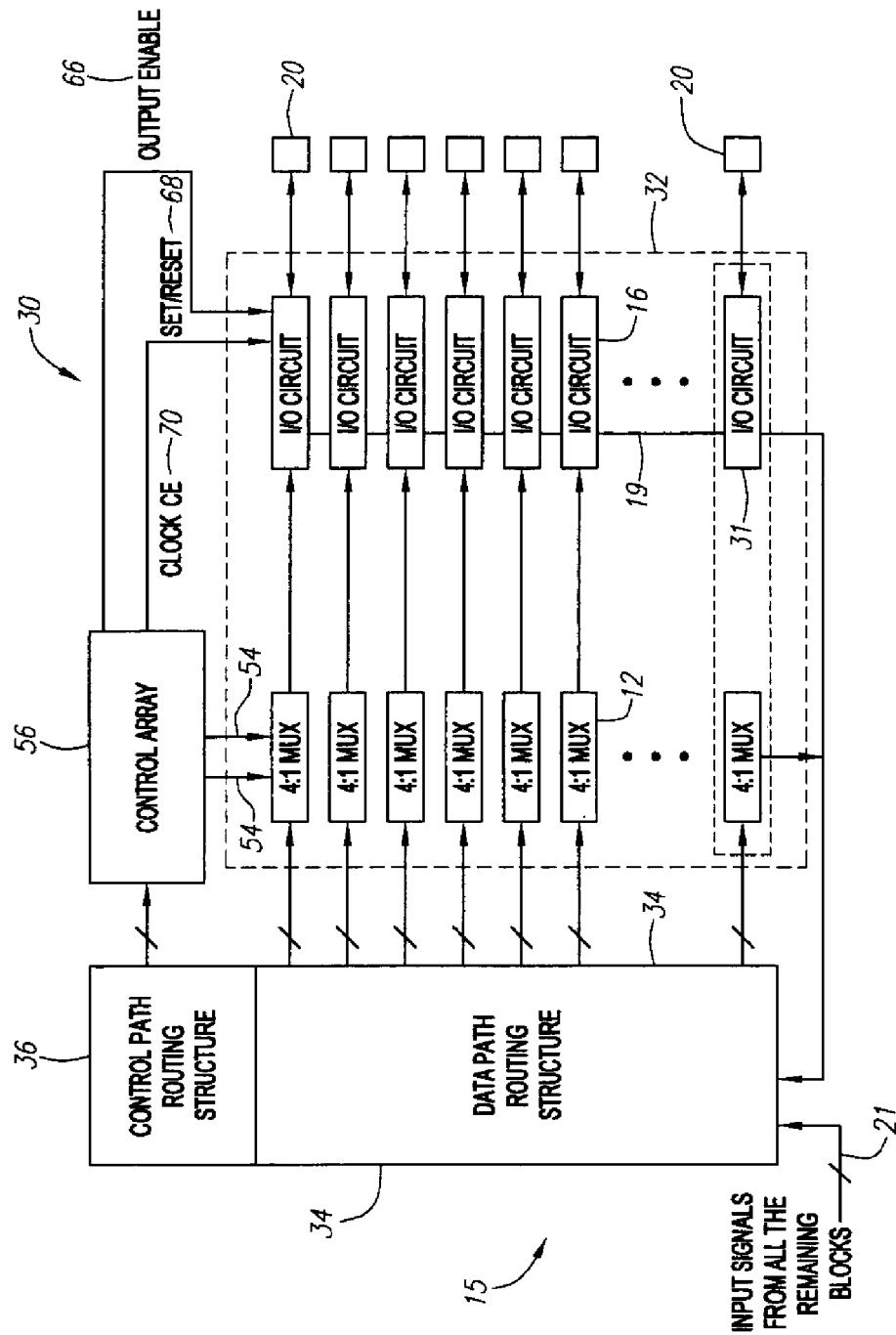
Figure 3:
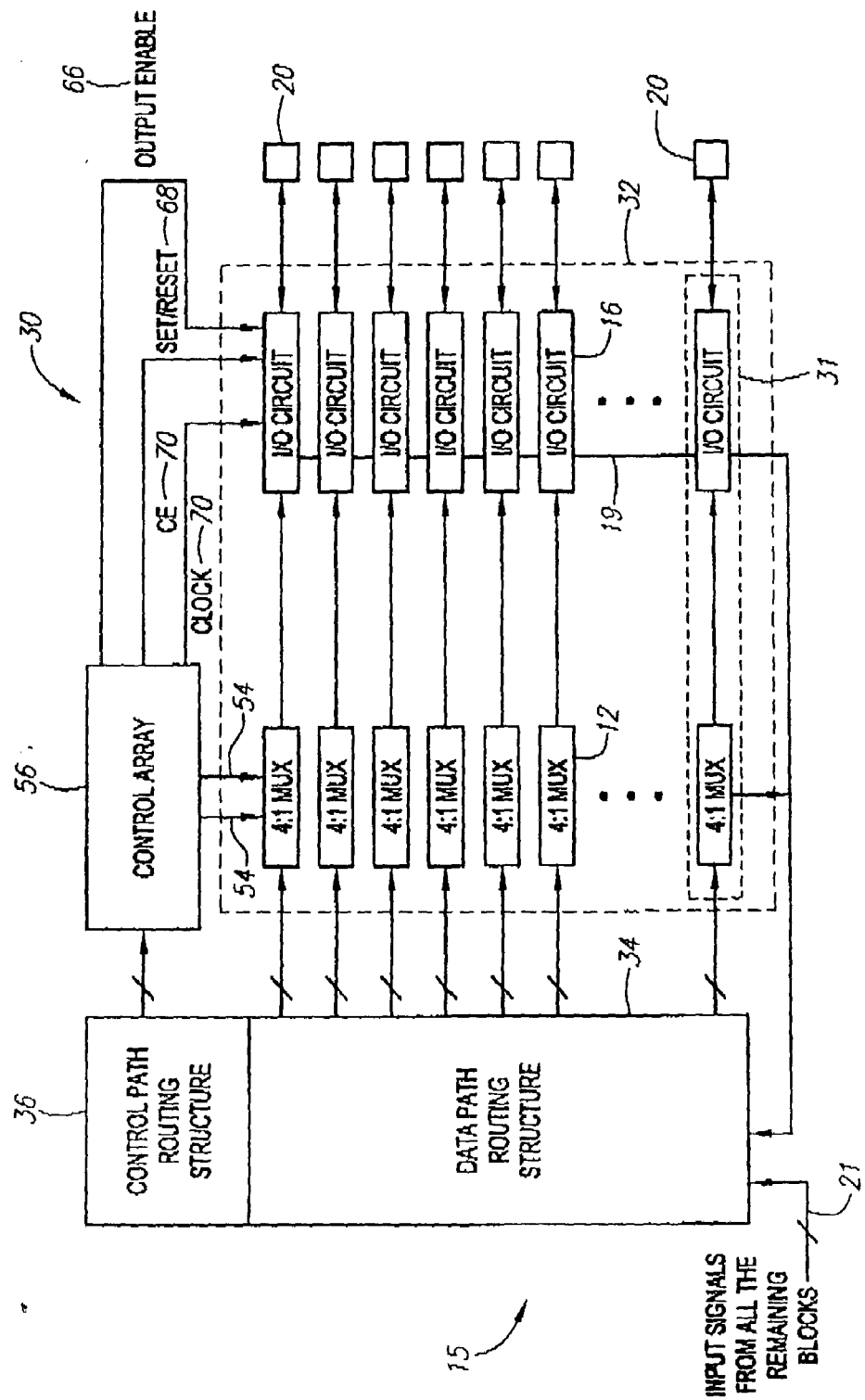

However, unlike the second level data-path routing structure 42, there is no need for the second level control-path routing structure 52 to have a fully-populated switch matrix, if an assumption is made about the use of the resulting device. For example, consider the MUX select signals 54 required to control the set of 4:1 MUXes 12 for each I/O block 32. Because each MUX 12 requires two MUX select signals, a fully independent MUX control structure would require 32 independent MUX select signals. However, in many applications such as bus switching, this level of independence would be wasted because the signals within a given bus are not switched independently and thus would not require independent MUX select signals. Grouping control signals permits the second level control-path routing structure 52 to comprise a partially-populated switch matrix as illustrated in FIG. 5b and fused such that it forms a 4:1 MUX for each of 32 output signals. Second level control-path routing structure 52 receives the 64 output signals (numbered 0 through 63) from first level control-path routing structure 50 and programmably routes these signals into 32 output signals (numbered 0 through 31). Second level routing structure 50 is two-way routed in that each input signal has two different paths it may take to reach the output. For example, input signal number 0 may be fused at the intersections 49 to form output signals numbers 0 and 16, thereby providing two ways for input signal number 0 to reach the output. It will be appreciated that the number of output signals is arbitrary and results from a trade-off between fuse count and flexibility. These same design considerations control whether the second level control-path routing structure 52 has a fully or partially-populated switch matrix.

To generate independent control functions for the control signals developed by the control-path routing structure 36, the control array 56 within I/O block 32 (FIG. 3) has an AND array to form product-terms control signals as described more fully in co-pending U.S. application "I/O Block for a Programmable Interconnect Circuit." The control array 56 receives both the true and complement of the outputs from the second level control-path routing structure 52. For the embodiment having 32 output signals from the second-level control-path routing structure 52, the AND array thus receives 64 signals. The number of product terms derived from the AND array depends upon the balance desired between fuse count and flexibility, just as discussed with respect to the second level control-path routing structure 52. In one embodiment, 8 product-term MUX selects 54, four product-term clock/clock enable signals 70, four product-term set/resets 68, and four product-term OE signals 66 are produced. It will be appreciated that the actual number of each type of product-term control signal produced by the AND array is arbitrary and is driven by a tradeoff between fuse count and control function flexibility.

Figures 4, 4B, 5, 6:
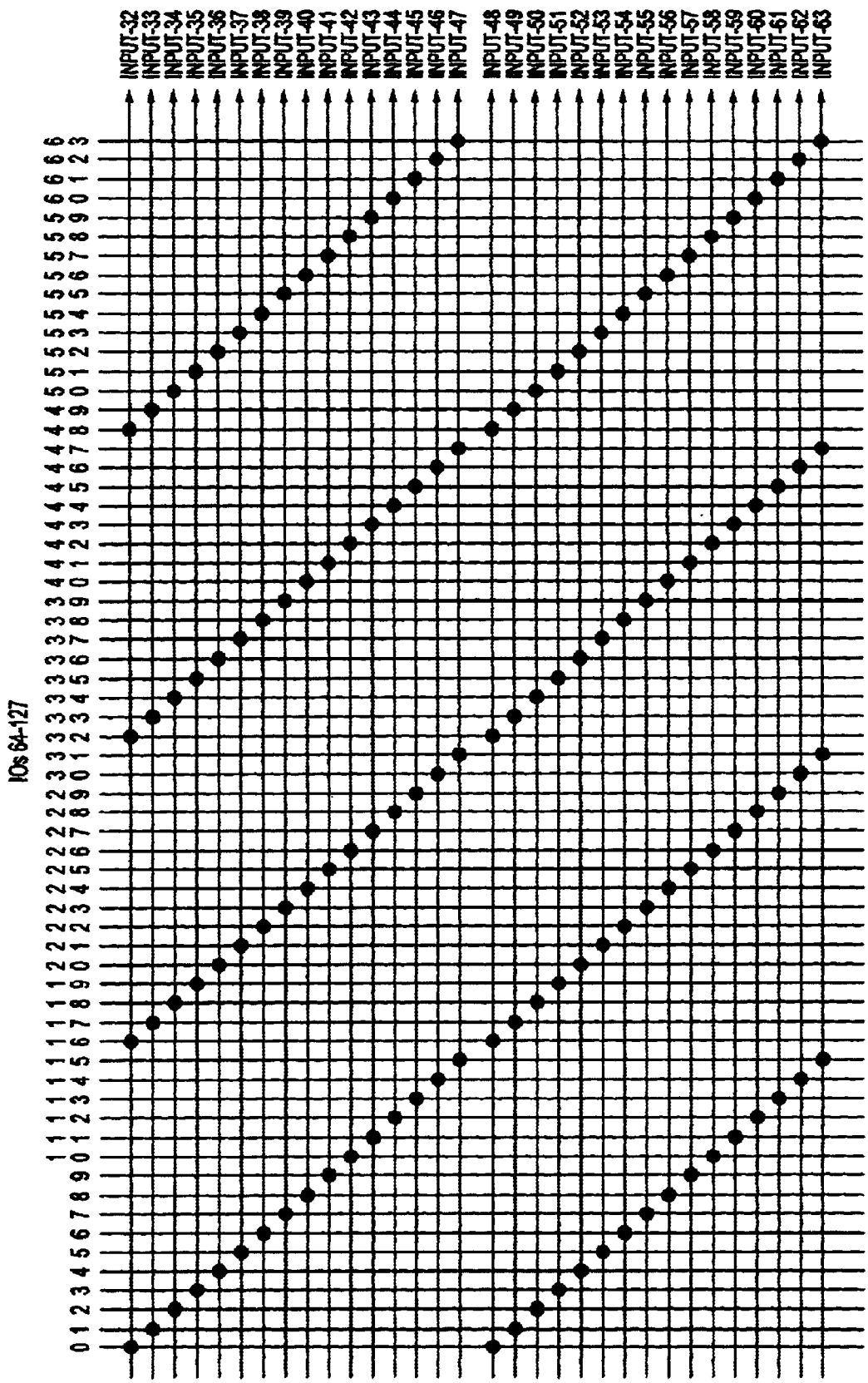
Figures 4, 4B, 5, 6, 7:
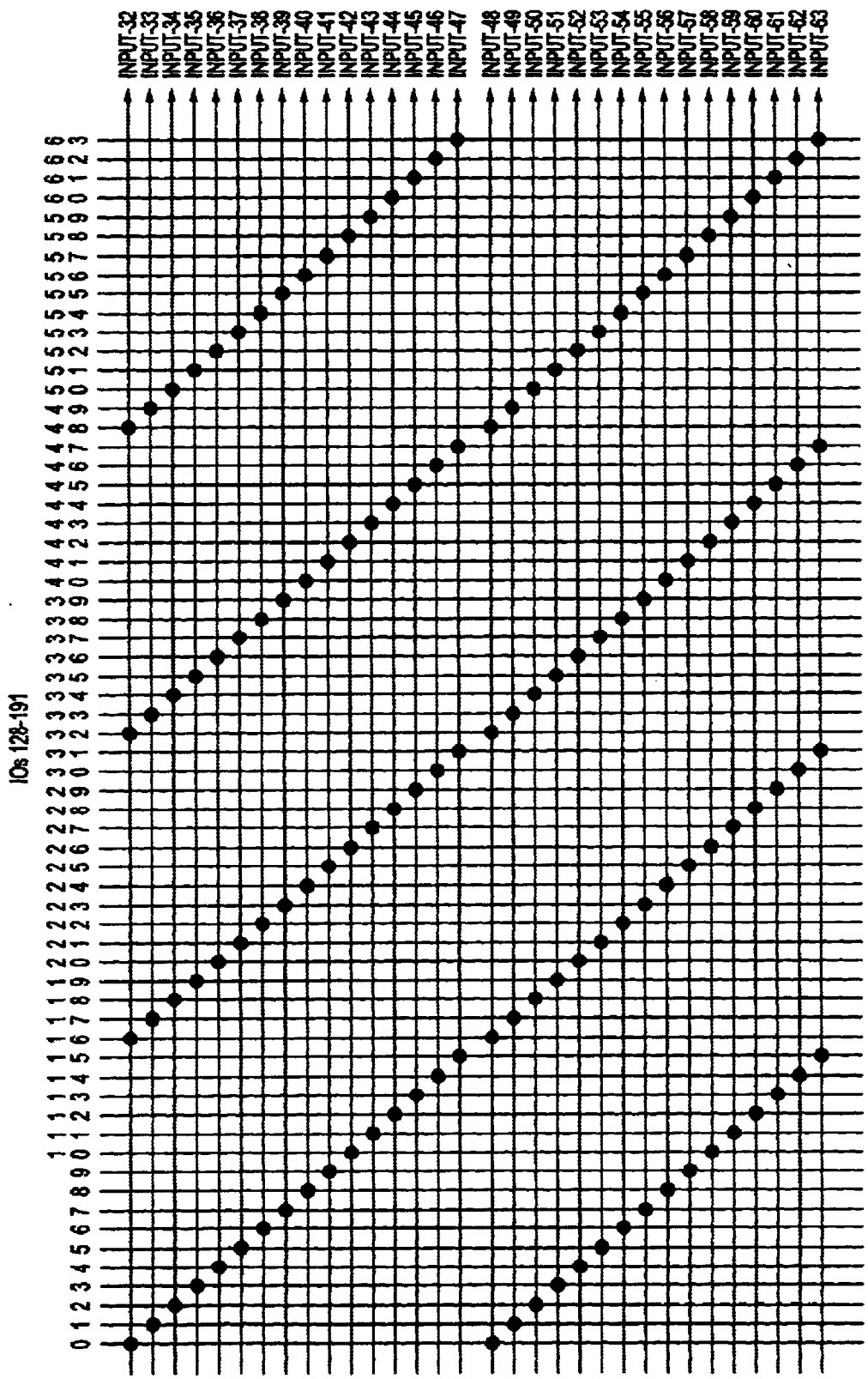
Figures 4, 4B, 5, 6, 7, 8:
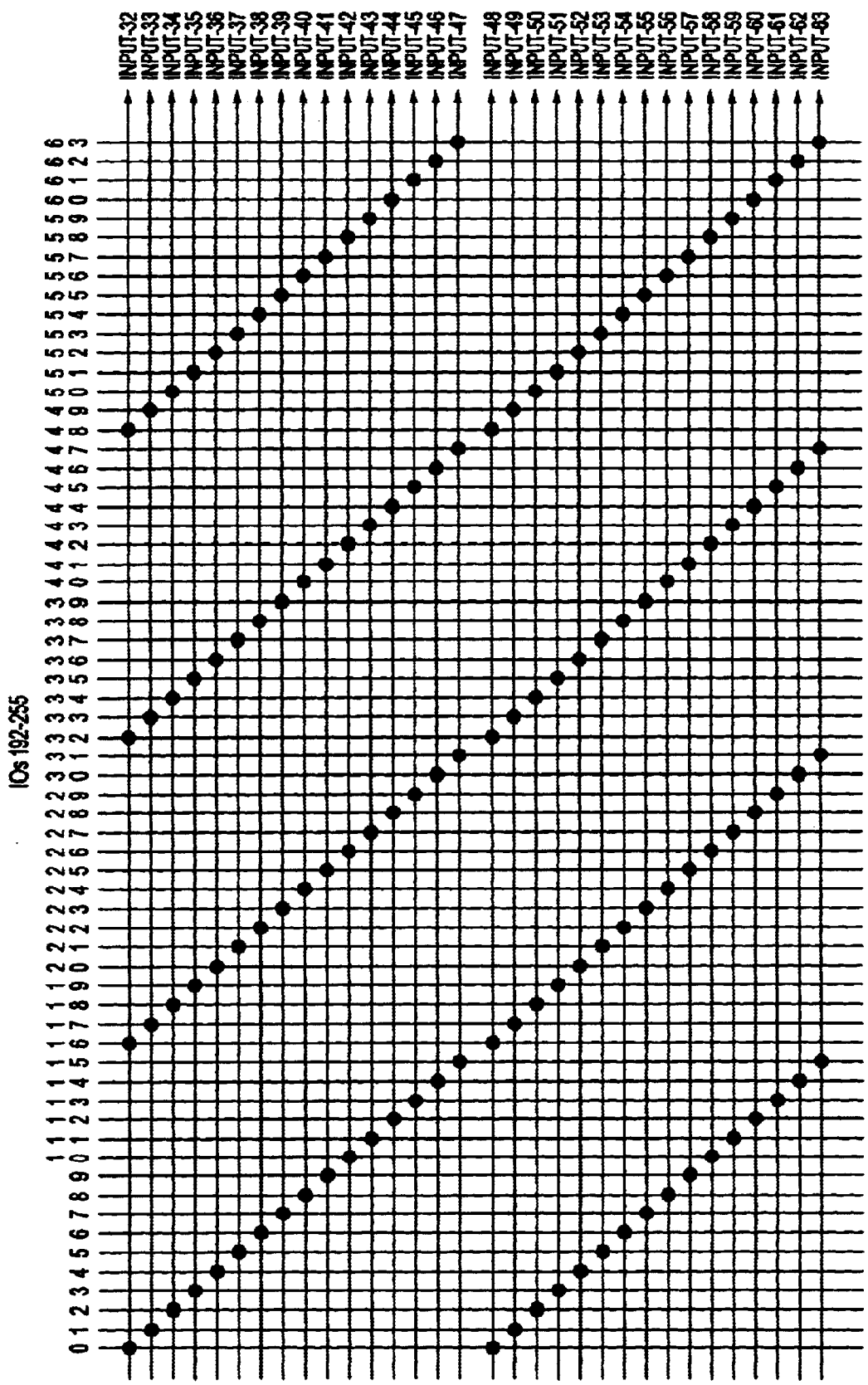
Figures 1, 4C:
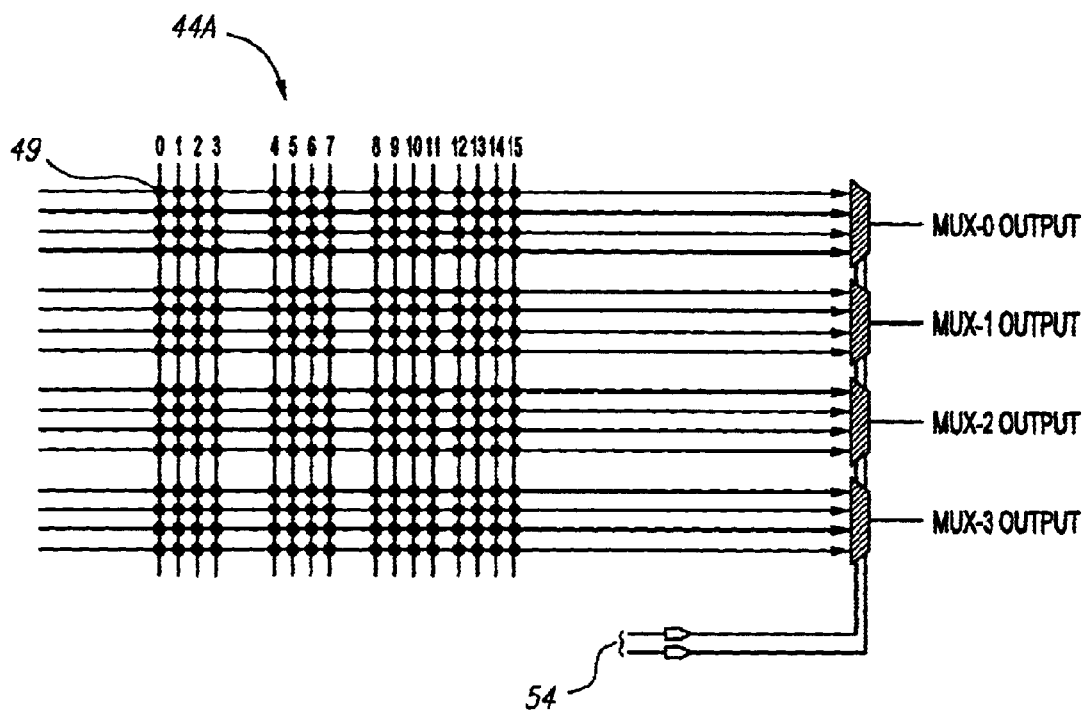
FIG. 4c illustrates a fusing pattern for the second level data-path routing structure of FIG. 4b.
Figures 2, 4C:
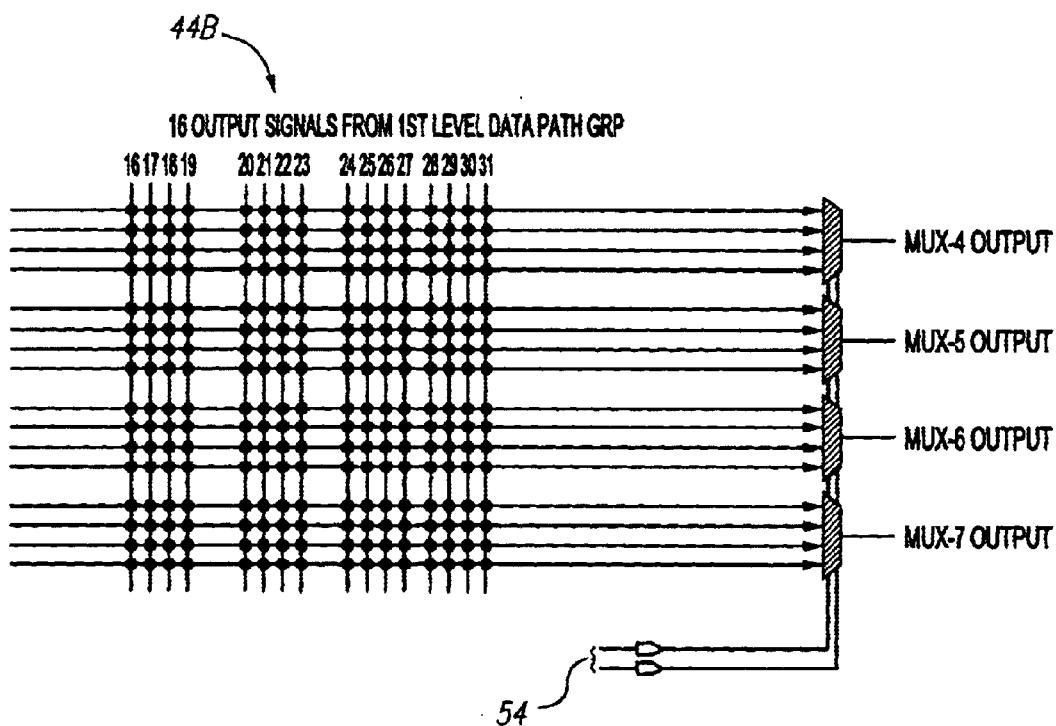
Figures 3, 4C:
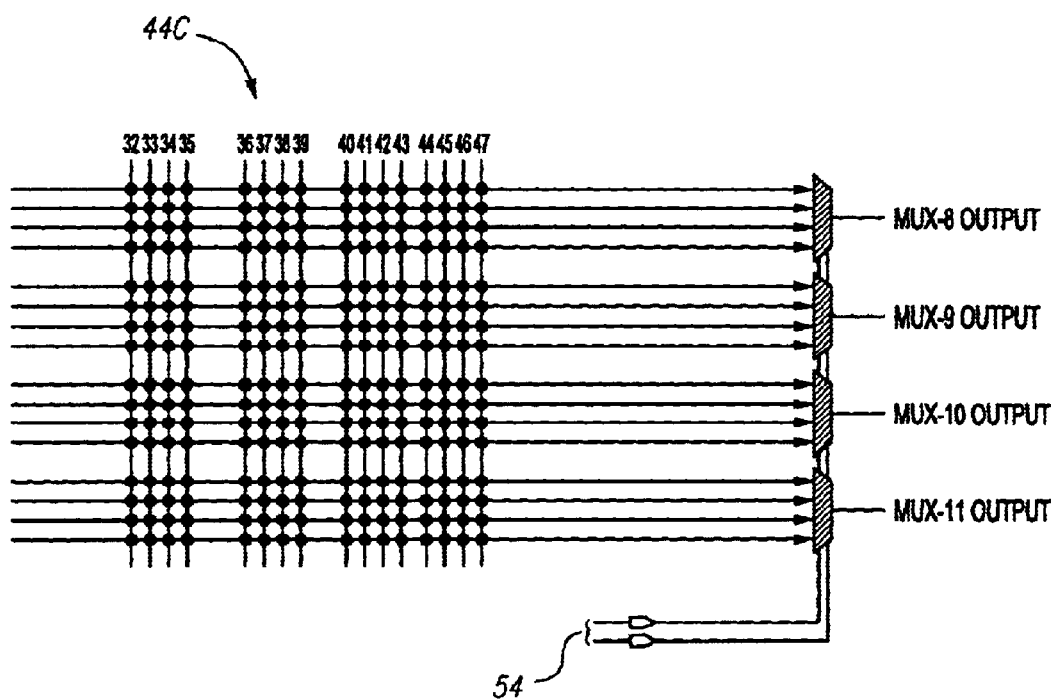
Figures 4, 4C:
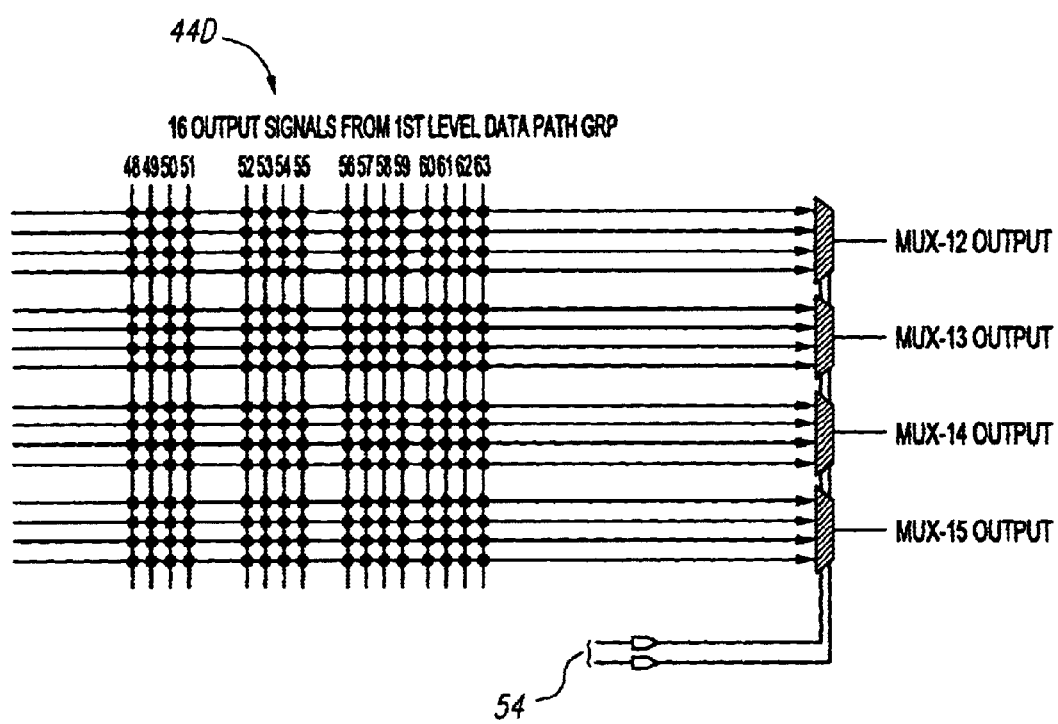

Turning now to FIG. 6, an embodiment for the I/O circuit 16 of FIG. 3 has an input register 90 and an output register 92 separated, providing true bi-directional input and output capabilities. 4:1 MUX 12 selects among four input signals from second level data-path routing structure 42. Output register 92 receives the output of 4:1 MUX 12 and provides a registered output signal Q to an output buffer 18, which in turn provides an output signal to its pin 20. An OE register 94 controls the output buffer 18. Input register 90 may receive an input signal from pin 20. A feedback or input MUX 101 for the I/O cell 31 selects outputs from the 4:1 MUX 12, the output register 92, and the input register 90, providing a fast feedback path to its I/O block's routing structure 15.

An output register bypass MUX 95 selects between either the registered output Q of output register 92 or the unregistered output of 4:1 MUX 12. In this fashion, output buffer 18 may receive either a registered or unregistered output signal. In addition, the output register bypass MUX 95 provides polarity control for either output signal. To prevent ground bounce, output register bypass MUX 95 couples to output buffer 18 through a programmable delay element 112. Similarly, another programmable delay element 114 adjusts the hold time of the input register 90. Each register 90, 92, and 94 and 4:1 MUX 12 within I/O circuit 16 receives product-term control signals from the control array 56 (FIG. 3). The product-term MUX select signals 54 couple through polarity selection MUXes 117 to the 4:1 MUX 12. The coupling of the remaining product-term register control signals is further described in copending U.S application "I/O Block for a Programmable Interconnect Circuit."

The fusing of the routing structures 15 to form the programmable interconnect and the fusing of the AND arrays as well as the configuration of the remaining devices is controlled through signals stored in non-volatile memory. This non-volatile memory may be in-system programmable. In-system programmable circuits are discussed, for example, in U.S. Pat. No. 5,237,218 to G. Josephson et al., filed on May 3, 1991 and issued on Aug. 17, 1993. The disclosure of U.S. Pat. No. 5,237,218 is hereby incorporated by its entirety to provide background information regarding in-system programmable circuits. In addition to in-system programmability, the programmable interconnect device disclosed herein may also have boundary scan test capability compliant with IEEE Std. 1149.1 (the "JTAG standard"). The JTAG standard, which is set forth in *IEEE Standard Test Access Port and Boundary-Scan Architecture*, published by the Institute of Electrical and Electronics Engineers, Inc. (May 1990) is well-known to those in the art.

Although the invention has been described with reference to particular embodiments, the description is only an example of the invention's application and should not be taken as a limitation. For example, the invention may be applied to create routing structures with multiple levels greater than two. Consequently, various adaptations and combinations of features of the embodiments disclosed are within the scope of the invention as encompassed by the following claims.

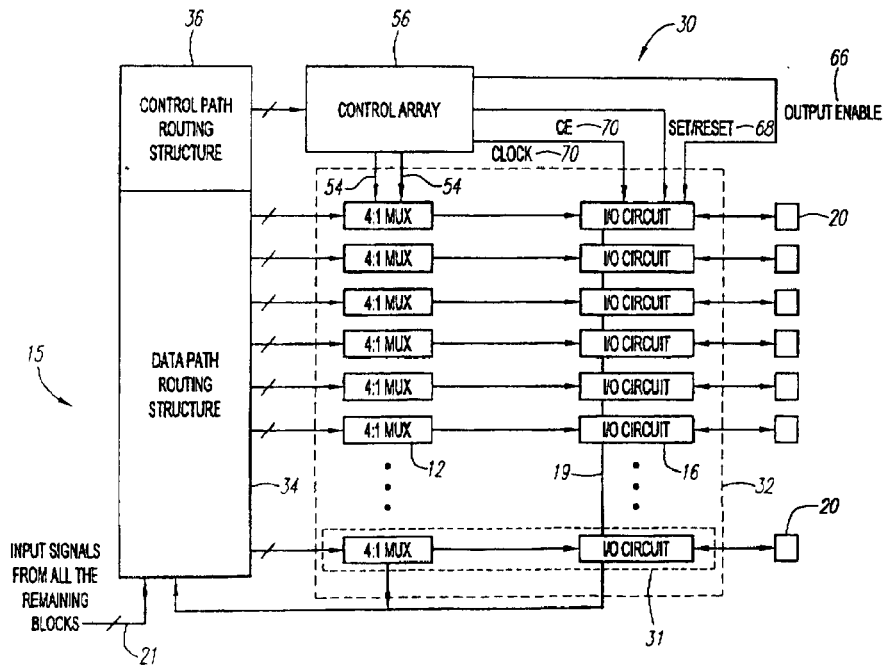

We claim:

1. A programmable interconnect circuit, comprising:
   a plurality of input/output (I/O) cells, wherein the I/O cells are arranged into a plurality N of I/O blocks, and wherein N is an integer and each I/O cell includes a multiplexer and a register associated with a pin of the programmable interconnect circuit; and
   a plurality of N routing structures corresponding to the plurality of N I/O blocks, each routing structure having a partially-populated first switch matrix for programmably routing input signals from each of the I/O cells into a first set of output signals, each routing structure also having a second switch matrix for programmably routing signals from the first set of output signals into a second set of output signals, the second set of output signals being coupled to I/O cells within the routing structure's I/O block.

2. The programmable interconnect circuit of claim 1, wherein the signals programmably routed by each second switch matrix are data signals.

3. The programmable interconnect circuit of claim 1, wherein the signals programmably routed by each second switch matrix are control signals.

4. The programmable interconnect circuit of claim 2, wherein each multiplexer within each I/O cell is configured to receive a plurality of signals from its I/O block's routing structure's second set of output signals and select a register input signal, and wherein each register of each I/O cell comprises an output register coupled to receive the register input signal from its multiplexer.

5. The programmable interconnect circuit of claim 4, wherein each multiplexer comprises a 4:1 multiplexer.

6. The programmable interconnect circuit of claim 1, wherein each routing structure programmably routes signals from each of the I/O cells into the first set of output signals according to configuration data stored in a non-volatile memory and programmably routes signals from the first set of output signals into the second set of output signals according to configuration data stored in the non-volatile memory.

7. A programmable interconnect circuit, comprising:
   a plurality of input/output (I/O) cells, wherein the I/O cells are arranged into a plurality N of I/O blocks, and wherein N is an integer and each I/O cell includes a multiplexer and a register associated with a pin of the programmable interconnect circuit;
   a plurality of N data-path routing structures corresponding to the plurality of N I/O blocks, each data-path routing structure having a partially-populated first switch matrix for programmably routing data signals from each of the I/O cells into a first set of data output signals; each data-path routing structure also having a second switch matrix for programmably routing data signals from the first set of data output signals into a second set of data signals, the second set of data signals being coupled to the multiplexers in the I/O cells within the data-path routing structure's I/O block; and
   a plurality of N control-signal routing structures corresponding to the plurality of N I/O blocks, each control-signal routing structure having a partially-populated switch matrix for programmably routing control signals from each of the I/O cells into a first set of control output signals; each control-signal routing structure also having a second switch matrix for programmably routing control signals from the first set of control output signals into a second set of control output signals, the second set of control output signals being coupled to the I/O cells within the control-signal routing structure's I/O block.

8. The programmable interconnect circuit of claim 7, wherein each of the second switch matrices in the plurality of N data-path routing structures is fully-populated.

9. The programmable interconnect circuit of claim 8, wherein each of the second switch matrices in the plurality of N control-signal routing structures is partially-populated.

10. The programmable interconnect circuit of claim 7, wherein each multiplexer for each I/O cell within a I/O block is configured to receive a plurality of signals from its I/O block's data-path routing structure's second set of data signals and select a register input signal, and wherein each register of each I/O cell within a I/O block comprises an output register coupled to receive the register input signal from the multiplexer.

11. The programmable interconnect circuit of claim 10, wherein each multiplexer receives a control signal from the I/O block's control-signal routing structure's second set of control output signals to control the selection of the register input signal.

12. The programmable interconnect circuit of claim 11, wherein each I/O cell within a I/O block further comprises an input register to receive signals from the I/O cell's pin, wherein the input register receives control signals from its I/O block's control-path routing stucture's second set of control output signals.

13. The programmable interconnect circuit of claim 12, wherein each I/O cell within a I/O block further comprises an output enable register coupled to its I/O block's control-signal routing structure's second set of control output signals, the output enable register controlling an output buffer coupling an output from the I/O cell's output register to its pin.

14. The programmable interconnect circuit of claim 13, wherein each input register, output register, and output enable register is configured to receive set and reset signals from their respective control-signal routing structure's second set of control output signals.

15. The programmable interconnect circuit of claim 14, wherein each output enable register is configured to receive an output enable signal from its respective control-signal routing structure's second set of control output signals.

16. The programmable interconnect circuit of claim 15, wherein each output enable register, input register, and output register is coupled to receive clock signals from their respective control-signal routing structure's second set of control output signals.

17. The programmable interconnect circuit of claim 16, wherein each output enable register, input register, and output register is coupled to receive clock enable signals from their respective control-signal routing structure's second set of control output signals.

18. The programmable interconnect circuit of claim 7, wherein each data-path routing structure and control-signal routing structure programmably routes signals according to configuration data stored in non-volatile memory.

19. A programmable interconnect circuit, comprising:
a plurality of input/output (I/O) cells; and
a plurality of programmable routing structures sharing a common set of input terminals for receiving input signals from each of the I/O cells, each routing structure having a different set of output terminals coupled to a I/O block of I/O cells and programmable to route input signals received on the input terminals through the routing structure's output terminals to the I/O block of I/O cells.

20. The programmable interconnect circuit of claim 19, wherein each routing structure includes a partially-populated first stage coupled to the common set of input terminals and a fully-populated second stage coupled to the first stage and to the set of output terminals for the routing structure.

21. The programmable interconnect circuit of claim 20, wherein each stage comprises a programmable switch matrix.

22. The programmable interconnect circuit of claim 19, wherein each I/O block of I/O cells comprises at least eight I/O cells, each I/O cell including a multiplexer coupled to an I/O circuit.

23. The programmable interconnect circuit of claim 19, wherein each routing structure includes a control path routing structure and a data path routing structure independent of each other.

24. The programmable interconnect circuit of claim 19, wherein each routing structure corresponds to a single I/O block of I/O cells.

25. A programmable interconnect circuit, comprising:
a plurality of input/output (I/O) cells arranged into I/O blocks, wherein each I/O block of I/O cells comprises at least two I/O cells, each I/O cell including a multiplexer coupled to an I/O circuit; and
a plurality of data path routing structures sharing a common set of input terminals for receiving input signals from each of the I/O cells, each data path routing structure having a different set of output terminals coupled to the multiplexers of a corresponding block of I/O cells and programmable to route input signals received on the input terminals through the routing structure's output terminals to the I/O block of I/O cells; and
a plurality of control path routing structures sharing the common set of input terminals for receiving input signals from each of the I/O cells, each control path routing structure having a different set of output terminals coupled to the I/O circuit of the corresponding block of I/O cells and programmable to route input signals received on the input terminals through the routing structure's output terminals to the I/O block of I/O cells,
wherein each data path and control path routing structure includes a partially-populated first stage coupled to the common set of input terminals and a second stage coupled to the first stage and to the set of output terminals for the routing structure.

26. The programmable interconnect circuit of claim 25, wherein the second stage of the data path routing structure is fully populated.

27. The programmable interconnect circuit of claim 25, wherein the second stage of the control path routing structure is partially populated.

* * * * *

UNITED STATES PATENT AND TRADEMARK OFFICE
CERTIFICATE OF CORRECTION

PATENT NO. : 6,653,861 B1
DATED : November 25, 2003
INVENTOR(S) : Agrawal et al.

It is certified that error appears in the above-identified patent and that said Letters Patent is hereby corrected as shown below:

Drawings,
Replace drawing sheet 3 of 18 with the attached drawing.

Signed and Sealed this

Fourth Day of January, 2005

JON W. DUDAS
*Director of the United States Patent and Trademark Office*

UNITED STATES PATENT AND TRADEMARK OFFICE
CERTIFICATE OF CORRECTION

PATENT NO.        : 6,653,861 B1
APPLICATION NO. : 10/023053
DATED             : November 25, 2003
INVENTOR(S)       : Agrawal et al.

It is certified that error appears in the above-identified patent and that said Letters Patent is hereby corrected as shown below:

Delete the title page and substitute therefor the attached title page.
Drawings,
Replace drawing sheet 3 of 18 with the attached drawing.

This certificate supersedes Certificate of Correction issued January 4, 2005.

Signed and Sealed this

Third Day of October, 2006

JON W. DUDAS
*Director of the United States Patent and Trademark Office*

(12) United States Patent
Agrawal et al.

(10) Patent No.: US 6,653,861 B1
(45) Date of Patent: Nov. 25, 2003

(54) MULTI-LEVEL ROUTING STRUCTURE FOR A PROGRAMMABLE INTERCONNECT CIRCUIT

(75) Inventors: Om P. Agrawal, Los Altos, CA (US); Jinghui Zhu, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 7 days.

(21) Appl. No.: 10/023,053

(22) Filed: Dec. 14, 2001

(51) Int. Cl.$^7$ .............................................. H03K 19/77
(52) U.S. Cl. .............................. 326/41; 326/40; 326/39
(58) Field of Search ................................. 326/38–41

(56) References Cited

U.S. PATENT DOCUMENTS

| | | | |
|---|---|---|---|
| 5,886,538 A | * 3/1999 | New | 326/40 |
| 5,986,470 A | * 11/1999 | Cliff et al. | 326/41 |
| 6,034,541 A | * 3/2000 | Kopec et al. | 326/39 |
| 6,104,207 A | * 8/2000 | Chan et al. | 326/40 |
| 6,184,713 B1 | 2/2001 | Agrawal et al. | |

* cited by examiner

Primary Examiner—Vibol Tan
(74) Attorney, Agent, or Firm—MacPherson Kwok Chen & Heid LLP

(57) ABSTRACT

A programmable interconnect circuit comprising a plurality of I/O cells arranged into I/O blocks includes a routing structure for each I/O block, wherein each routing structure may have a partially populated first level for programmably routing signals from the I/O cells into a first set of output signals. A second level of the routing structure programmably routes signals from the first set of output signals to I/O cells in the routing structure's I/O block.

27 Claims, 18 Drawing Sheets